(12) United States Patent
Huang et al.

(10) Patent No.: US 11,199,878 B2
(45) Date of Patent: Dec. 14, 2021

(54) CASING STRUCTURE

(71) Applicant: PEGATRON CORPORATION, Taipei (TW)

(72) Inventors: Mei-Hsueh Huang, Taipei (TW); Ho-Ching Huang, Taipei (TW); Wen-Cheng Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 296 days.

(21) Appl. No.: 16/184,948

(22) Filed: Nov. 8, 2018

(65) Prior Publication Data

US 2019/0179375 A1 Jun. 13, 2019

(30) Foreign Application Priority Data

Dec. 8, 2017 (TW) ................................. 10621830.6

(51) Int. Cl.
*H05K 5/06* (2006.01)
*G06F 1/16* (2006.01)

(52) U.S. Cl.
CPC .............. *G06F 1/1656* (2013.01); *G06F 1/16* (2013.01); *H05K 5/062* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,574,254 A | * | 11/1996 | Mori ..................... | H02G 3/088 174/561 |
| 6,344,612 B1 | * | 2/2002 | Kuwahara ............ | H01L 31/048 174/50 |
| 6,653,567 B2 | * | 11/2003 | Ritter .................... | B60K 37/02 174/50 |
| 9,295,175 B2 | * | 3/2016 | Ichikawa ............... | H05K 5/063 |
| 9,423,029 B2 | * | 8/2016 | Coenegracht ........ | H01R 13/508 |
| 9,917,427 B2 | * | 3/2018 | Rost ...................... | H02G 3/088 |
| 9,949,394 B2 | * | 4/2018 | Kamoshida .......... | H05K 5/0026 |
| 10,508,469 B2 | * | 12/2019 | Wong ....................... | E05B 9/02 |
| 10,630,150 B2 | * | 4/2020 | Tsuboi ..................... | B25J 9/126 |
| 2001/0040037 A1 | * | 11/2001 | Negishi ................. | H05K 5/061 174/17 CT |

(Continued)

FOREIGN PATENT DOCUMENTS

TW M561976 6/2018

OTHER PUBLICATIONS

"Search Report of Europe Counterpart Application", dated Apr. 11, 2019, p. 1-p. 9.

(Continued)

*Primary Examiner* — Krystal Robinson
(74) *Attorney, Agent, or Firm* — J.C. Patents

(57) ABSTRACT

A casing structure including a first housing, a glue layer, and a second housing is provided. The first housing has a first inner edge. The glue layer is disposed at the first inner edge. The second housing has a second inner edge. The first housing is assembled to the second housing, and the first inner edge is aligned with the second inner edge. The glue layer abuts against the second inner edge so as to combine the first housing with the second housing. A gap formed between the glue layer and a part of the second inner edge is defined as a glue overflow buffer area.

7 Claims, 3 Drawing Sheets

(56) References Cited

U.S. PATENT DOCUMENTS

| | | | | |
|---|---|---|---|---|
| 2002/0084271 | A1* | 7/2002 | Sato | H02G 3/088 |
| | | | | 220/3.8 |
| 2006/0089034 | A1* | 4/2006 | Chen | H05K 5/0013 |
| | | | | 439/164 |
| 2008/0230282 | A1* | 9/2008 | Cox | H05K 5/06 |
| | | | | 177/238 |
| 2012/0320544 | A1* | 12/2012 | Ohhashi | H05K 5/062 |
| | | | | 361/752 |
| 2013/0012059 | A1* | 1/2013 | Xiao | H02G 3/16 |
| | | | | 439/535 |
| 2013/0120943 | A1* | 5/2013 | Tamura | H05K 5/069 |
| | | | | 361/752 |
| 2013/0176665 | A1* | 7/2013 | Oi | H05K 5/061 |
| | | | | 361/679.01 |
| 2014/0091536 | A1* | 4/2014 | Bae | H05K 5/06 |
| | | | | 277/641 |
| 2014/0219588 | A1* | 8/2014 | McCulfor | F16C 29/02 |
| | | | | 384/26 |
| 2014/0374133 | A1* | 12/2014 | Rost | H05K 5/061 |
| | | | | 174/50.51 |
| 2015/0145386 | A1 | 5/2015 | Chang | |
| 2015/0250072 | A1* | 9/2015 | Ichikawa | H05K 5/0069 |
| | | | | 439/587 |
| 2017/0179364 | A1 | 6/2017 | Schwartz et al. | |
| 2017/0188376 | A1 | 6/2017 | Noh et al. | |
| 2019/0386473 | A1* | 12/2019 | Kawashita | H02G 3/081 |
| 2020/0200335 | A1* | 6/2020 | Bullmer | H02G 3/088 |

OTHER PUBLICATIONS

"Office Action of Europe Counterpart Application", dated Nov. 18, 2020, p. 1-p. 6.

\* cited by examiner

CASING STRUCTURE

CROSS-REFERENCE TO RELATED APPLICATION

This application claims the priority benefit of Taiwan application serial no. 106218306, filed on Dec. 8, 2017. The entirety of the above-mentioned patent application is hereby incorporated by reference herein and made a part of this specification.

BACKGROUND

Technology Field

The invention relates to a casing structure and more particularly, to a casing structure applied to an electronic device.

Description of Related Art

Electronic components inside a commonly seen electronic device, for example, a notebook computer, a tablet computer or smart cell phone, are usually protected by a casing. The casing may be generally separated into two housings assembled to each other, though there might be a gap remaining in between after the two housings are assembled. In order to prevent moisture, dust or external particles from entering into the electronic device through the aforementioned gap, a common method is to dispose an isolation layer in the junction between the two housings. However, the isolation layer may be melted or softened after having been squeezed, heated and damped for a long time, and the isolation layer may leak from the aforementioned gap, or an oil leakage may occur to the isolation layer due to the material characteristics. As a result, the appearance of the electronic device may be influenced, or that may even cause use inconvenience.

SUMMARY

The invention provides a casing structure capable of improving phenomena of glue overflow and oil leakage.

A casing structure provided by the invention includes a first housing, a glue layer, and a second housing. The first housing has a first inner edge. The glue layer is disposed at the first inner edge. The second housing has a second inner edge. The first housing is assembled to the second housing, and the first inner edge is aligned with the second inner edge. The glue layer abuts against the second inner edge so as to combine the first housing with the second housing. A gap formed between the glue layer and a part of the second inner edge is defined as a glue overflow buffer area.

In an embodiment of the invention, the first housing has a first groove disposed at the first inner edge, the glue layer is disposed in the first groove, and the glue layer has a joint portion protruding from the first groove.

In an embodiment of the invention, the second housing has a second groove disposed at the second inner edge and a rib adjacent to the second groove, the rib is embedded in the joint portion, and the second groove is filled with a part of the joint portion.

In an embodiment of the invention, a height that the joint portion exceeds over the first groove is equal to a height of the rib.

In an embodiment of the invention, the second groove has a bottom surface and a side surface, and the side surface and the rib are disposed side by side and individually connected to the bottom surface.

In an embodiment of the invention, the joint portion has a surface located between the rib and the side surface, and respective gaps formed between the side surface and the surface, and between the bottom surface and the surface are defined as the glue overflow buffer area.

In an embodiment of the invention, a cross section area, perpendicular to the bottom surface, of the glue overflow buffer area is greater than ½ of a cross section area, perpendicular to the bottom surface, of the rib.

In an embodiment of the invention, a distance between the rib and the side surface is smaller than a width of the first groove.

In an embodiment of the invention, wherein a shape of a cross section, perpendicular to the bottom surface, of the rib is a bullet.

In an embodiment of the invention, the rib is aligned with ½ of the width of the first groove.

Base on the above, the casing structure provided by the invention has a design of glue overflow buffer for accommodating a part of the glue layer which is melted or softened or leaking oil, such that the part of the glue layer which is melted or softened or the leaking oil can be prevented from leaking through the gap between the two housings. Thus, the casing structure provided by the invention can achieve the improvement of glue overflow and oil leakage to maintain completeness of the appearance of the casing structure.

In order to make the aforementioned and other features and advantages of the invention more comprehensible, several embodiments accompanied with figures are described in the detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
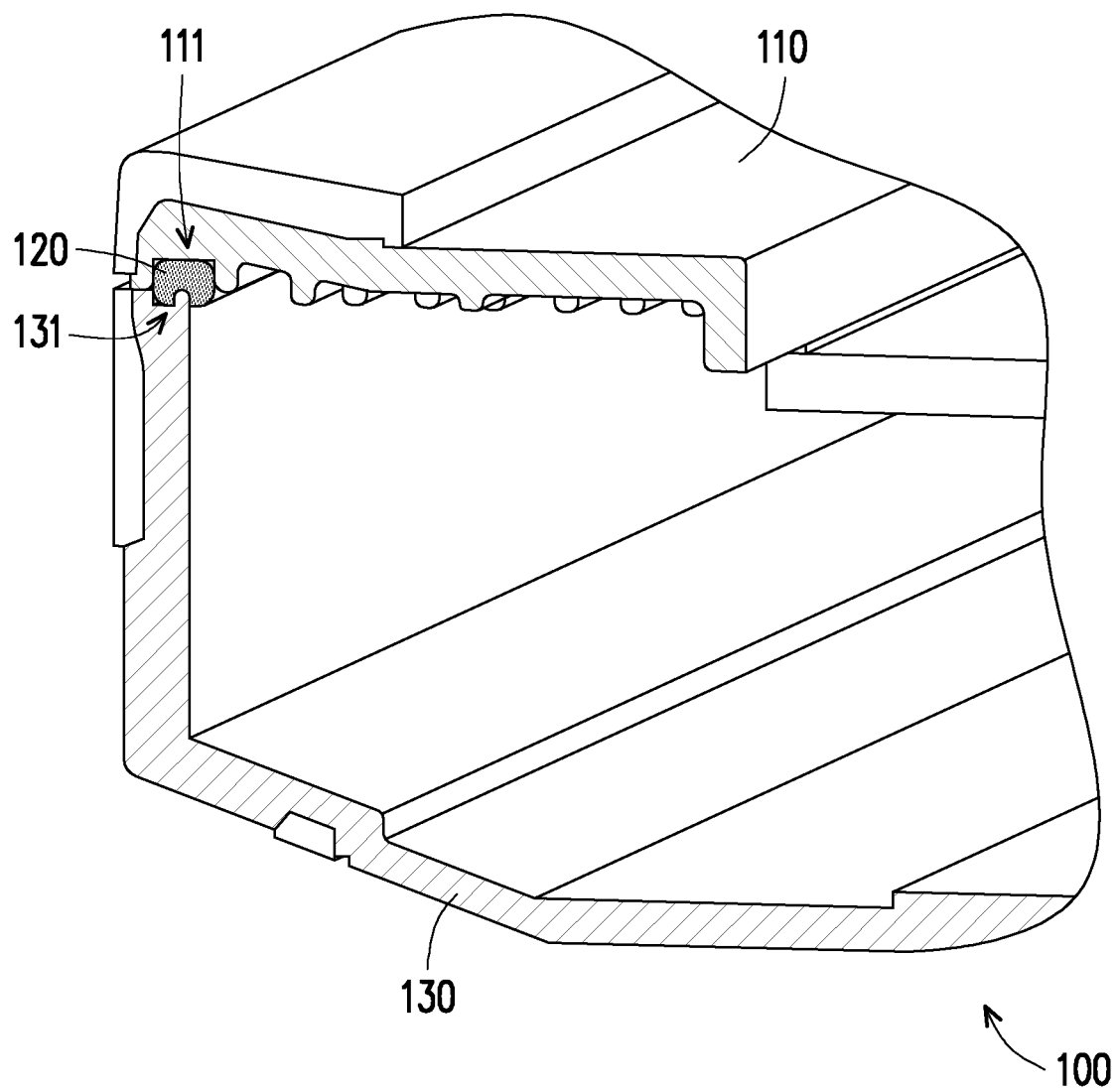
FIG. 1 is a partially cross-section schematic diagram illustrating a casing structure according to an embodiment of the present invention.
Figure 2:
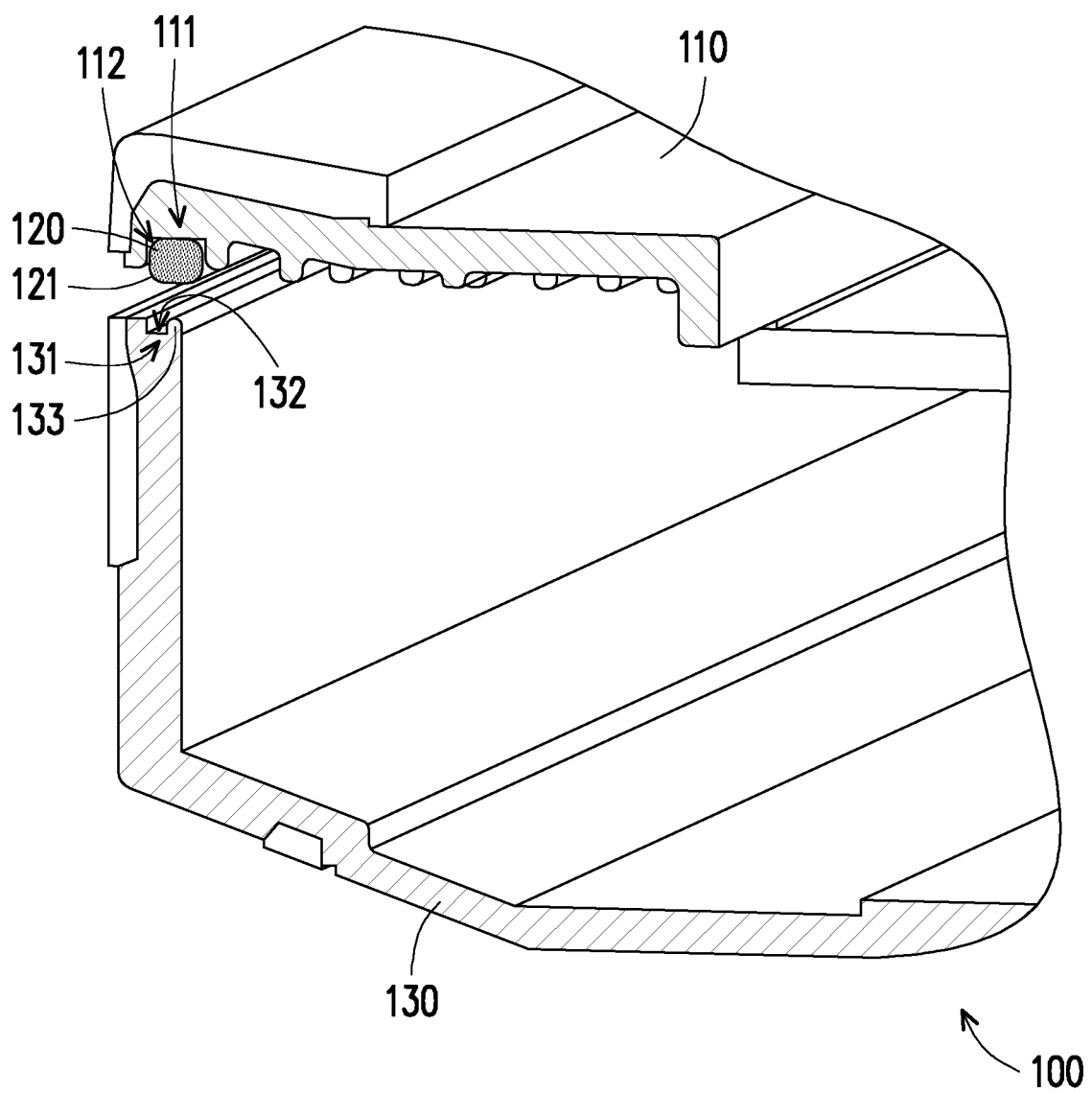
FIG. 2 is an exploded schematic diagram illustrating the casing structure depicted in FIG. 1.
Figure 3:
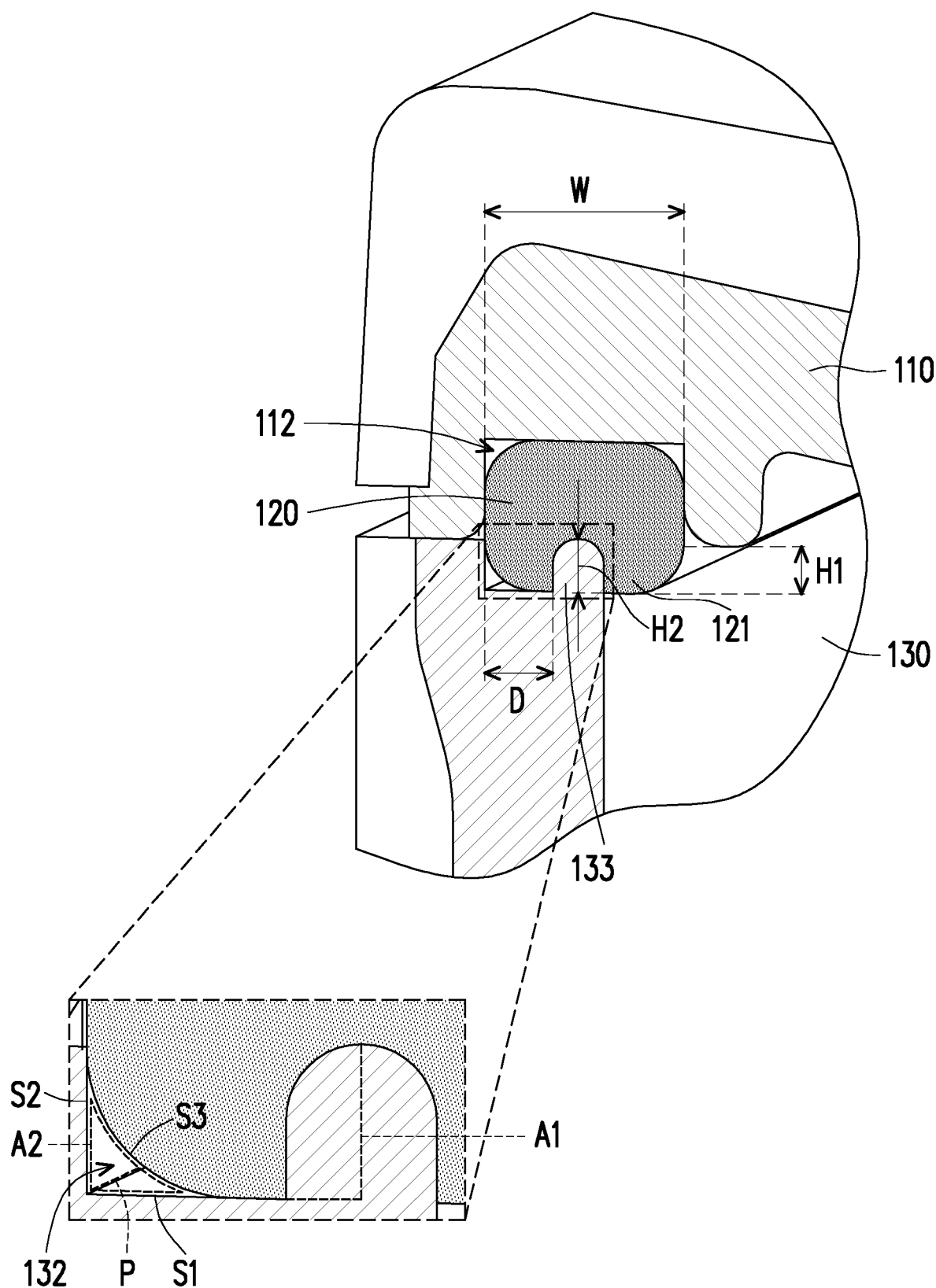
FIG. 3 is a partially enlarged schematic diagram illustrating the casing structure depicted in FIG. 1.

FIG. 1 is a partially cross-section schematic diagram illustrating a casing structure according to an embodiment of the present invention. FIG. 2 is an exploded schematic diagram illustrating the casing structure depicted in FIG. 1. FIG. 3 is a partially enlarged schematic diagram illustrating the casing structure depicted in FIG. 1. Referring to FIG. 1 to FIG. 3, in the present embodiment, a casing structure 100 may be used by an electronic device, such as a laptop, a tablet computer or a smart phone for protecting electronic components inside the electronic device. The casing structure 100 includes a first housing 110, a glue layer 120, and a second housing 130. Materials of the first housing 110 and the second housing 130 may be metal, plastic, a carbon fiber or a combination of the aforementioned materials, but the materials of the first housing 110 and the second housing 130 are not limited in the invention.

The first housing 110 and the second housing 130 are assembled to each other. In other words, an inner surface of the first housing 110 and an inner surface of the second housing 130 face to each other. In the present embodiment, the first housing 110 has a first inner edge 111, i.e., a surrounding edge of the inner surface of the first housing 110. On the other hand, the second housing 130 has a second inner edge 131, i.e., a surrounding edge of the inner surface of the second housing 130. During the assembly process of the first housing 110 and the second housing 130, the first inner edge 111 has to be firstly aligned with the second inner edge 131, and the first inner edge 111 abuts against the second inner edge 131 after the assembly is completed, but a gap still exists between the first inner edge 111 and the second inner edge 131.

In order to increase assembly strength between the first housing 110 and the second housing 130, the glue layer 120 is disposed at the first inner edge 111 and abuts against the second inner edge 131. A gap formed between the glue layer 120 and a part of the second inner edge 131 is defined as a glue overflow buffer area P. On the other hand, the glue layer 120 is configured to block a way through which moisture, dust or foreign matters may enter into the casing structure, so as to prevent moisture, dust or foreign matters from entering into the casing structure 100 through the gap between the first housing 110 and the second housing 130.

Furthermore, the first housing 110 has a first groove 112 disposed at the first inner edge 111, wherein the first groove 112 may be an annular groove surrounding the edge of the inner surface of the first housing 110, and the glue layer 120 is disposed in the first groove 112. During a process of applying a glue material, for example, the first groove 112 is filled with the glue to allow the glue layer 120 to slightly protrude from the first groove 112, and the glue material is then solidified and forms the glue layer 120. Wherein, the glue layer 120 has a joint portion 121 protruding from the first groove 112, and the joint portion 121 has a height H1. For instance, the glue material for forming the glue layer 120 may be an epoxy resin or any other waterproof glue material.

The second housing 130 has a second groove 132 disposed at the second inner edge 131 and a rib 133 adjacent to the second groove 132, wherein the second groove 132 may be an annular groove surrounding the edge of the inner surface of the second housing 130, and the rib 133 may be an annular rib surrounding the edge of the inner surface of the second housing 130. The first groove 112 is aligned with the second groove 132 and the rib 133, and the rib 133 extends toward the first groove 112. Thereby, after the first housing 110 is assembled to the second housing 130, the glue layer 120 has contact with the second groove 132 and the rib 133. Furthermore, the joint portion 121 of the glue layer 120 protrudes from the first groove 112 and has contact with the second groove 132 and the rib 133, wherein the second groove 132 is filled with at least a part of the joint portion 121, and the rib 133 is embedded in the joint portion 121, and with the design of the second groove 132 and the rib 133, a joint area and the assembly strength between the second housing 130 and the glue layer 120 are increased. In addition, the rib 133 may also be employed to block moisture, dust or foreign matters from entering into the casing structure 100 through the gap between the first housing 110 and the second housing 130.

In the present embodiment, a height of the rib 133 is H2, and the height H2 of the rib 133 may be equal to the height H1 of the joint portion 121, thereby ensuring that the rib 133 is embedded in the joint portion 121 during the assembly process of the first housing 110 and the second housing 130. In other embodiments, the height of the rib may be smaller than or greater than the height of the joint portion.

Continuously referring to FIG. 1 to FIG. 3, before the first housing 110 is assembled to the second housing 130, the glue layer 120, for example, does not touch two opposite walls of the first groove 112, and during the assembly process of the first housing 110 and the second housing 130, the glue layer 120 is deformed and touches the two opposite walls of the first groove 112 because of being pushed by the rib 133. On the other hand, the second groove 132 has a bottom surface S1 and a side surface S2, wherein the side surface S2 and the rib 133 are perpendicular to the bottom surface S1, and the side surface S1 and the rib 133 which are disposed side by side substantially have the same height. Furthermore, during the assembly process of the first housing 110 and the second housing 130, the joint portion 121 of the glue layer 120 is pushed by the rib 133 so the second groove 132 is filled with at least part of the joint portion 121 and the joint portion 121 has contact with the partial side surface S2 and the partial bottom surface S1. After the first housing 110 is assembled to the second housing 130, the joint portion 121 the second groove 132 is filled with has a surface S3 located between the rib 133 and the side surface S2, and respective gaps are formed between the rib 133 and the surface S3, and between the side surface S2 and the surface S3, such that the glue overflow buffer area P is defined by the side surface S2, the bottom surface S1 and the surface S3 jointly.

In the present embodiment, a cross section area A1 of the glue overflow buffer area P perpendicular to the bottom surface S1 is, for example, greater than ½ of a cross section area A2 of the rib 133 perpendicular to the bottom surface S1. When the glue layer 120 is melted or softened due to the heat or other ambient factors or when the oil leakage occurs, the melted or softened glue layer 120 or the leaking oil is guided by the rib 133 and flows into the glue overflow buffer area P and to be accommodated in the glue overflow buffer area P without overflowing out from the gap between the first housing 110 and the second housing 130.

On the other hand, a distance D between the rib 133 and the side surface S2 is smaller than a width W of the first groove 112, thereby ensuring that the rib 133 may be embedded in the joint portion 120 during the assembly process of the first housing 110 and the second housing 130. As illustrated in FIG. 3, the rib 133 is aligned with ½ of the width W of the first groove 112, but the invention is not limited thereto. The rib 133 is disposed without exceeding a depth of the first groove 112 and is not limited to be aligned with ½ of the width W of the first groove 112. On the other hand, a cross section, perpendicular to the bottom surface S1 of the rib 133 has a shape of a bullet with the bullet head facing the first inner edge 111. When the glue layer 120 touches the rib 133, the bullet head of the rib 133 may facilitate the rib 133 to be embedded successfully with less obstruction during the assembly. In other embodiments, the cross section, perpendicular to the bottom surface S1, of the rib 133 may also be more tapering or in other shapes.

Based on the above, the casing structure provided by the invention can utilize the glue layer to block the way through which moisture, dust or external particles may enter into the casing structure from the gap between the two housings, and the glue overflow buffer area provided between the glue layer and the inner edge of one of the housings is configured for accommodating a part of the glue layer which is melted or softened or leaking oil, such that the part of the glue layer which is melted or softened or the leaking oil can be prevented from leaking from the gap between the two housings. Thus, the casing structure provided by the invention can achieve the improvement of glue overflow and oil leakage to maintain completeness of the appearance of the casing structure. Moreover, a degree of adhesion between the first and the second housings can be reinforced via the joint of the rib and the glue layer, thereby enhancing properties, such as waterproof and dust-resistance, of the casing structure.

Although the present invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A casing structure, comprising:
    a first housing, having a first inner edge;
    a glue layer, disposed at the first inner edge; and
    a second housing, having a second inner edge, wherein the first housing is assembled to the second housing, the first inner edge is aligned with the second inner edge, the glue layer abuts against the second inner edge so as to combine the first housing with the second housing, and a gap formed between the glue layer and a part of the second inner edge is defined as a glue overflow buffer area,
    wherein the first housing has a first groove disposed at the first inner edge, the glue layer is disposed in the first groove, and the glue layer has a joint portion protruding from the first groove, and
    the second housing has a second groove disposed at the second inner edge and a rib adjacent to the second groove, the rib is embedded in the joint portion, and the second groove is filled with a part of the joint portion,
    wherein a height that the joint portion protrudes over a top peripheral surface of the first groove to a bottom surface of the second groove is equal to a height of the rib.

2. The casing structure according to claim 1, wherein the second groove has a bottom surface and a side surface, and the side surface and the rib are disposed side by side and individually connected to the bottom surface.

3. The casing structure according to claim 2, wherein the joint portion has a surface located between the rib and the side surface, and respective gaps formed between the side surface and the surface, and between the bottom surface and the surface are defined as the glue overflow buffer area.

4. The casing structure according to claim 3, wherein a cross sectional area of the glue overflow buffer area is greater than ½ of a cross sectional area of the rib.

5. The casing structure according to claim 2, wherein a distance between the rib and the side surface is smaller than a width of the first groove.

6. The casing structure according to claim 2, wherein a cross sectional area of the rib is rectangular.

7. The casing structure according to claim 1, wherein the rib is aligned with ½ of a width of the first groove.

* * * * *